United States Patent [19]

Johnson et al.

[11] 4,246,647
[45] Jan. 20, 1981

[54] DIFFERENTIAL MAGNETO-RESISTIVE DETECTOR FOR CROSS-TIE WALL MEMORY SYSTEM

[75] Inventors: Leslie H. Johnson, Minneapolis; George F. Nelson, Coon Rapids; Vernal M. Benrud, Eagan, all of Minn.

[73] Assignee: Sperry Corporation, New York, N.Y.

[21] Appl. No.: 20,761

[22] Filed: Feb. 23, 1979

[51] Int. Cl.³ .............................................. G11C 11/02
[52] U.S. Cl. ........................................ 365/8; 365/38; 365/87
[58] Field of Search ................................... 365/35–44, 365/81, 87, 8

[56] References Cited

U.S. PATENT DOCUMENTS 4,024,516  5/1977  Torok ..................................... 365/87
4,075,612  2/1978  Johnson et al. ........................ 365/35

OTHER PUBLICATIONS

*Crosstie Memory Simplified by Use of Serrated Strips,* Schwee et al., Nav. Surf. Weapons Ctr.; 624–625; 12/75

*Progress Toward Crosstie Memory V;* Schwee et al., NSWC/WOL TR 78-11; pp. 1–17; Jan. 1978.

*Primary Examiner*—Marshall M. Curtis
*Attorney, Agent, or Firm*—Kenneth T. Grace; William E. Cleaver; Marshall M. Truex

[57] ABSTRACT

A method of and an apparatus for magneto-resistively detecting information in a cross-tie memory system is disclosed. The detector includes a first conductive element, which is the terminating portion of an electrically-conducting wide-narrow edged propagating drive line, and second and third conductive elements that are serially aligned along a magnetic, serrated-edged data track, which three conductive elements form two gaps therebetween. The two gaps are oriented along the data track at respective narrow portions, a first narrow portion which may support a cross-tie but which second narrow portion will not support a cross-tie. A differential sense amplifier is coupled across the two gaps using the second narrow portion as a reference segment to differentially detect the presence vel non of a cross-tie in the first narrow portion.

9 Claims, 15 Drawing Figures

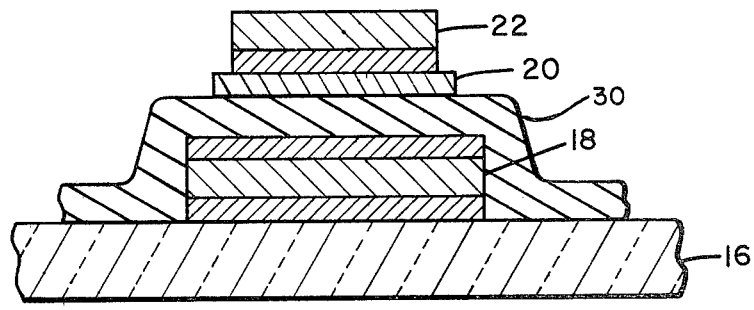
Fig. 2
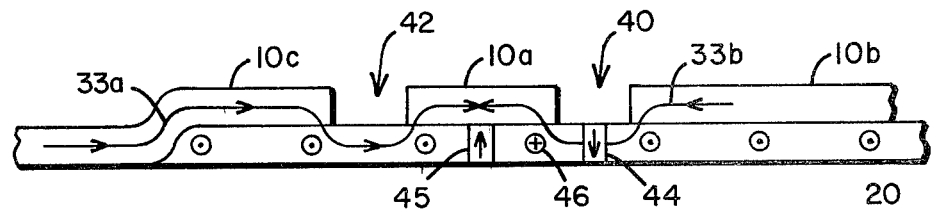
Fig. 3
| FUNCTION | GENERATOR | LINES | CURRENT SIGNAL |
|---|---|---|---|
| GENERATE | 48 | 12a, 12b | 100 ns, 15 ma |
| WIDE PUSH | 60 | 18<br>22 | 10 μs, 60 ma<br>10 μs, 19 ma |
| WIDE NUCLEATE | 61 | 18 | 50 ns, 105 ma |
| NARROW ANNIHILATE | 62 | 18<br>22 | 25 μs, 62 ma<br>25 μs, 46 ma |
| DETECT | 36 | 36a, 36b | 5 μs, 5 ma |
| NARROW PUSH | 63 | 18<br>22 | 15 μs, 26 ma<br>15 μs, 13 ma |
| NARROW NUCLEATE | 64 | 18 | 50 ns, 105 ma |
| WIDE ANNIHILATE | 65 | 18<br>22 | 25 μs, 110 ma<br>25 μs, 21 ma |
Fig. 7

DIFFERENTIAL MAGNETO-RESISTIVE DETECTOR FOR CROSS-TIE WALL MEMORY SYSTEM

BACKGROUND OF THE INVENTION

The propagation of inverted Néel wall sections in a serial accessed memory system was proposed by L. J. Schwee in the publication "Proposal On Cross-tie Wall and Bloch-line Propagation In Thin Magnetic Films," IEEE Transactions on Magnetics, MAG 8, No. 3, pages 405–407, September, 1972. Such a memory system utilizes a ferromagnetic film strip of approximately 81% Ni-19% Fe approximately 350 Angstroms (Å) thick in which cross-tie walls can be changed to Néel walls and Néel walls can be changed to cross-tie walls by applying appropriate fields. Associated with the cross-tie walls is a section of inverted Néel wall that is bounded by a cross-tie on one end and a Bloch-line on the other end.

In such a cross-tie wall memory system, information is entered at one end of the serial access memory system by the generation of an inverted Néel wall section, formed by a cross-tie on one side and a Bloch-line on the other, that is representative of a stored binary 1 or of a non-inverted Néel wall section (i.e., the absence of a cross-tie, Bloch-line pair) that is representative of a stored binary 0. Such information is moved or propagated along the cross-tie wall by the successive generation (and then the selective annihilation) of inverted Néel wall sections at successive memory cells along the cross-tie wall. In the D. S. Lo, et al, U.S. Pat. No. 3,906,466 there is disclosed a propagation circuit for the transfer of inverted Néel wall sections through successive memory cells along the cross-tie walls. In the L. J. Schwee U.S. Pat. No. 3,868,660; in a Naval Ordinance Laboratory Report NOLTR 73-185; in the publication "Cross-tie Memories Simplified by the Use of Serrated Strips," L. J. Schwee, et al, AIP Conference Proceedings, No. 29, 21st Annual Conference on Magnetism and Magnetic Materials, 1975, published April, 1976, pages 624–625, and in the publication "Cross-Tie/Bloch-Line Detection," G. J. Cosimini, et al, AIP Conference Proceedings, No. 3, 23rd Annual Conference on Magnetism and Magnetic Materials, 1978, published March, 1978, pages 1828–1830, there have been published some recent results of the further development of cross-tie wall memory systems and of detectors for the readout of binary information that is stored therein.

In a cross-tie wall memory system, the selective generation and propagation of the digital data representing inverted Néel wall sections about associated cross-ties and Bloch-lines have been demonstrated in the laboratory. Additionally, it has been shown that the data track of a cross-tie wall memory system may be configured into a film strip having repetitive patterns of asymmetrically serrated edge contours. Such film strip configurations are disclosed in the L. H. Johnson, et al, U.S. Pat. No. 4,075,612 and the L. J. Schwee U.S. Pat. No. 3,868,660, and in the publication "Cross-tie Memories Simplified by the Use of Serrated Strips," L. J. Schwee, et al, AIP Conference Proceedings No. 29, 21st Annual Conference on Magnetism and Magnetic Materials, 1975, published April, 1976, pages 624–625. More recently it has been proposed to construct cross-tie wall memory systems from a plurality of data tracks, each of which is formed as a strip of isotropic magnetic film, i.e., a film having substantially zero uniaxial anisotropy. The data-track-defining strip of isotropic magnetic film utilizes its shape, i.e., its edge contour, induced anisotropy, rather than its easy axis magnetic field induced anisotropy, to constrain the cross-tie wall within the planar contour of the film strip. The use of the shape induced anisotropy of an isotropic strip of magnetic film permits the use of nonlinear, i.e., curved, data tracks which may be configured into cross-tie wall memory systems that perform both memory and logic functions. Such a system is disclosed in the E. J. Torok U.S. Pat. No. 4,075,613.

Although the generation, propagation and logic manipulation of inverted-Néel-wall-section-defining data bits and the detection or readout thereof have received considerable study, one area that can still use improvement in the development of a workable cross-tie wall memory system is the detector or the device that reads out the information that is stored in the cross-tie wall memory system. Many such detectors or readout devices have been found to be workable and are disclosed in the patent literature—see the D. S. Lo, et al, U.S. Pat. No. 4,001,795; E. J. Torok, et al, U.S. Pat. No. 4,024,515; E. J. Torok U.S. Pat. No. 4,024,516, and the E. J. Torok, et al, U.S. Pat. No. 4,034,359. The present invention is directed toward an improved method of and an apparatus for reading out the information that is stored in a cross-tie wall memory system.

SUMMARY OF THE INVENTION

In the detector of the present invention, there is provided a method of differentially magneto-resistively detecting the presence vel non of a cross-tie in a cross-tie wall memory system. The detector includes three conductive elements that are serially aligned along a magnetic data track and that are spaced apart forming two gaps in one of which a cross-tie cannot exist. The cross-tie in the magnetic data track establishes a magnetic state that is different than the otherwise normal magnetic state of the data track and that produces a change in resistance to a current signal flowing therethrough. This change is interpreted by the detector as the presence of a cross-tie in the detector.

BRIEF DESCRIPTION OF THE DRAWINGS

FIG. 2 is an illustration of a cross-section of the memory plane of FIG. 1 taken along line 2—2 thereof illustrating the stacked, superposed elements of the shift register portion of FIG. 1.

FIG. 3 is an illustration of a cross-section of the memory plane of FIG. 1 taken along line 3—3 thereof illustrating the stacked, superposed elements of the detector of the present invention.

FIGS. 5a through 5i are schematic illustrations illustrating the generate/propagate/detect operations of a cross-tie, Bloch-line pair in the system of FIG. 1 as effected by the signals of the timing diagram of FIG. 4.

FIG. 7 is a table of illustrative current signal durations and magnitudes for the timing diagram of FIG. 4.

DESCRIPTION OF THE PREFERRED EMBODIMENT

Figure 1:
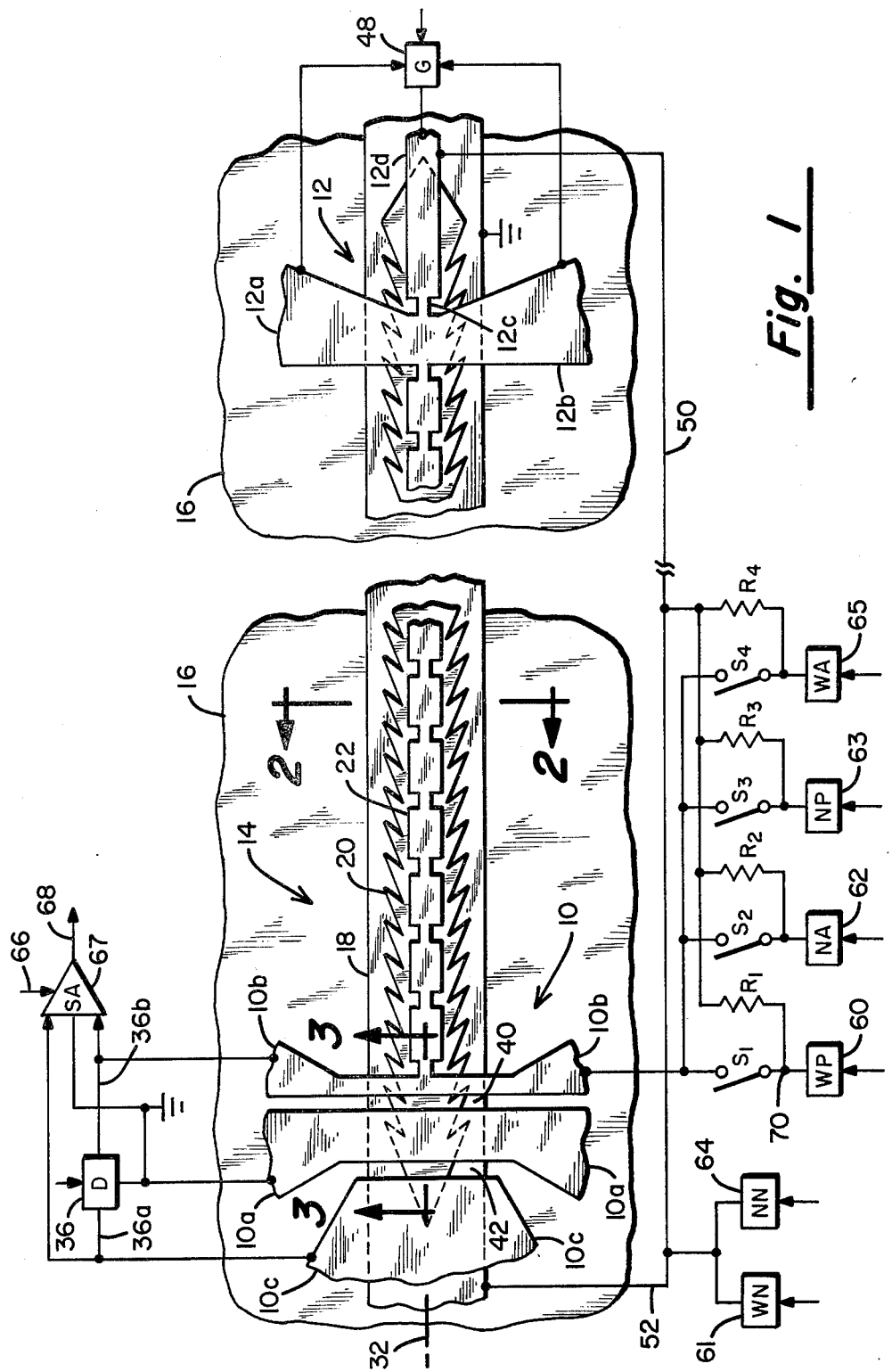
FIG. 1 is a schematic illustration of a portion of a cross-tie wall memory system illustrating, in detail, the detector of the present invention.

FIG. 1 is an illustration of a portion of a cross-tie wall memory system into which the detector 10 of the present invention has been incorporated. Also illustrated are the generator 12 of the cross-tie, Bloch-line pairs and the shift register 14 along which the cross-tie, Bloch-line pairs are propagated from the generator 12 into the detector 10.

FIG. 2 is an illustration of a cross-section of the memory plane of FIG. 1 taken along line 2—2 thereof for the purpose of illustrating the stacked, superposed elements of the shift register 14 of FIG. 1. The memory system of FIG. 1 includes a non-magnetizable, e.g., glass, substrate member 16 having the following active members arranged in a stacked, superposed integral assembly: conductive, e.g., gold, stripline 18; magnetizable, e.g., NiFe, data track 20; and conductive, e.g., gold, stripline 22. Not illustrated in FIG. 1, but illustrated in FIG. 2, are: a thin, adhesive layer of, e.g., chromium, that may be affixed to the top and/or the bottom surfaces of the metallic layers for ensuring an integral assembly of the metallic layers or the adjacent metallic or insulating layers; and, a thin, smoothing and insulating layer of, e.g., SiO, between the current conducting striplines 18 and 22. Still further, but not illustrated in either FIGS. 1 or 2, superposed this entire assembly and affixed to the top surface thereof, there may be provided an additional SiO sealing and insulating layer.

With respect to substrate 16 and stripline 18, such configuration may be similar to that of the D. S. Lo, et al, U.S. Pat. No. 3,906,466. Additionally, with respect to data track 20 it may be configured in the manner as taught by the L. J. Schwee U.S. Pat. No. 3,868,660 and in the publication "Cross-tie Memories Simplified by the Use of Serrated Strips," L. J. Schwee, et al, AIP Conference Proceedings, No. 29, 21st Annual Conference on Magnetism and Magnetic Materials, 1975, published April, 1976, pages 624–625; or in the manner as taught by the L. H. Johnson, et al, U.S. Pat. No. 4,075,612. With respect to the particular configuration or embodiment of data track 20, it is preferably configured into a film strip whose two opposing edges are formed into mirror-image, repetitive patterns of successive narrow portions that form wide portions therebetween by which the cross-tie, Bloch-line pairs are structured.

As is well known, such data track when effected by the proper drive fields establishes a cross-tie wall along its geometric centerline, which is substantially aligned with its longitudinal axis, identified as line 32 of FIG. 1. Preferably the film strip is isotropic, i.e., has substantially zero magnetic field induced anisotropy, and utilizes its shape, i.e., its edge contour, to constrain the cross-tie wall within the planar contour of and along the longitudinal axis 32. However, it is to be noted that data track 20 may be configured into a film strip whose two opposing edges are parallel, straight lines along which the positioning of the Bloch-line is structured solely by the configuration of a drive line such as taught by the E. J. Torok U.S. Pat. No. 4,075,613.

However, in the present illustrated embodiment of FIG. 1, stripline 22 is configured into a wide-narrow drive line comprised of an alternating series of wide-narrow portions in which the wide portion is approximately three times the length of the narrow portion. The narrow portion of stripline 22 is substantially centered about the alternate, i.e., every other, narrow portion of data track 20 while the wide portion of stripline 22 is substantially centered about the other alternate narrow portions of data track 20. For purposes of the present invention, the narrow portions of data track 20 and the associated narrow portions of stripline 22 are defined as a store segment, while the narrow portions of data track 20 and the associated wide portions of stripline 22 are defined as a transfer segment—see the D. S. Lo, et al, U.S. Pat. No. 3,906,466—both combining to comprise a memory cell, a plurality of which are aligned along the data track 20, stripline 22 of FIG. 1. Thus, the generator 12 of FIG. 1 is centered about a memory segment while the detector 10 is centered about a transfer segment. This will be explained further in the discussion of the operation of FIG. 1 as illustrated in FIGS. 5a through 5i and the timing diagram of FIG. 4.

With particular reference to FIG. 2, there is presented a cross-sectional view of the superposed stripline 18, data track 20 and stripline 22 of FIG. 1 taken along line 2—2 thereof for the purpose of illustrating the configuration of the stacked, superposed elements thereof. FIG. 2 illustrates that this stacked, superposed relationship includes the following listed successive layers:

glass substrate 16—0.50 mm thick
chromium adhesive layer—100 Å thick
gold stripline 18—1500 Å thick
chromium adhesive layer—100 Å thick
SiO insulative layer 30—12,500 Å thick
Permalloy data track 20—approximately 81% Ni—19% Fe, 350 Å thick
Chromium adhesive layer—100 Å thick
Gold stripline 22—1000 Å thick.

With particular reference to FIG. 3, there is presented a cross-sectional view of the detector 10 of the present invention taken along line 3—3 of FIG. 1. The cross-sectional view of detector 10 of FIG. 1 is taken for the exclusive purpose of illustrating the manner in which the read current drive signals 33a, 33b when coupled thereto by read current drive signal generator 36 are coupled to electrically conductive elements 10c, 10b to return to ground through the common electrically conductive element 10a. Accordingly, only elements of the cross-tie wall memory system of FIG. 1 that are affected by this flow of read current drive signals 33a, 33b are illustrated in FIG. 3 for the purpose of simplifying the illustration of the operation thereof.

In FIG. 3 there is illustrated the serrated-edged data track 20 upon which are integrally formed the conductive elements 10a, 10b, 10c of detector 10 that are positioned along the cross-tie wall in the serrated-edged data track 20 for forming the two gaps 40 and 42 therebetween. The separate drive current signals 33a and 33b are caused to flow from their corresponding conductive elements 10c and 10b, in the area of their associated gaps 42 and 40, down into the associated areas of the serrated-edged data track 20 and back into the common conductive elment 10a to ground. In the detector 10 of the present invention, due to the serrated-edged pattern of the data track 20 in the area of the detector 10, a cross-tie, Bloch-line pair may exist in the area of gap 40 but, because of the design of the terminating edge of data track 20, cannot exist in the area of gap 42. This is as illustrated in FIG. 1, wherein it is shown that in the area of gap 40 data track 20 has a serrated-edge pattern forming a narrow portion therebetween wherein a cross-tie may be structured; however, in the area of gap 42 it is shown that the serrated-edge pattern of data track 20 is discontinued with the serrated-edge of the opposing sides converging to a point whereby there is provided no narrow portion between consecutive serrated-edge portions of data track 20 within gap 42 where a cross-tie may be structured. Accordingly, as the cross-tie, Bloch-line pairs are propagated from generator 12 through shift register 14 and into and out of detector 10, the cross-tie, Bloch-line pairs, as they are propagated downstream of gap 40, are annihilated by the next subsequent Wide Annihilate drive field—see FIG. 4.

FIG. 3 illustrates the magnetic state of data track 20 in the area of detector 10 when a cross-tie, Bloch-line pair has been propagated into detector 10 with the cross-tie 44, Bloch-line 45 pair having the downwardly directed, upwardly directed, respectively, magnetization M as illustrated in FIG. 3. Additionally illustrated is the manner in which the magnetization M is oriented along the cross-tie wall in data track 20 as represented by the circles enclosing a dot or a cross indicating the direction of magnetization being directed out of or into, respectively, the plane of the drawing while the magnetization M within the cross-tie, Bloch-line pair are represented by the downwardly directed, upwardly directed, respectively, arrows indicated within cross-tie 44 and Bloch-line 45, respectively. Note that the circle 46 enclosing a cross indicates the inverted Néel wall section typical of the magnetization M orientation between a cross-tie and a Bloch-line pair.

With reference back to FIG. 1, there is illustrated a shift register 14, comprised of stripline 18, data track 20 and a terminating portion of stripline 22 having conductive elements 12a, 12b extending from a wide portion thereof followed by a narrow portion 12c, in which the cross-tie of the cross-tie, Bloch-line pair is created, and a wide end portion 12d. Shift register 14 is terminated on the other end by detector 10, consisting of conductive elements 10b, 10a, 10c for forming the gaps 40 and 42 therebetween.

In this illustrated embodiment, stripline 22 and its integral conductive elements 12a, 12b, 12c, 12d and 10b, and also the additionally electrically conductive elements 10a and 10c, are formed during the same, e.g., vacuum deposition, step of the same material and of the same thickness. This method of forming the generator 12 elements, the propagate drive line 22 elements and the detector 10 elements in one layer during the same process greatly simplifies the fabrication of a complete cross-tie wall memory system. Additionally, the memory plane of the cross-tie wall memmory system of FIG. 1 is symmetrical about its longitudinal axis or centerline 32 whereby current paths are symmetrical providing symmetry of the so-generated drive fields.

With particular reference to FIG. 4 and FIGS. 5a through 5i, there are presented illustrations of the timing diagrams and the resultant generation, propagation and detection of cross-tie, Bloch-line pairs in the cross-tie wall memory system of FIG. 1 and in particular the detection vel non of the cross-tie within gap 40 of the detector 10.

The propagation of the cross-tie, Bloch-line pairs along data track 10 under the influence of the drive fields provided by the coupling of the proper current drive signals to stripline 18 and stripline 22 will now be described. This requires a store-transfer sequence of the propagation of the cross-tie and the Bloch-line within the memory cell—see the D. S. Lo, et al, U.S. Pat. No. 3,906,466. In this method of propagation, the cross-tie wall is initially formed along the geometric centerline of the data track by an in-plane field that is directed normal to the longitudinal axis of the data track. The serrated edges of the data track, when the in-plane field is removed, cause the magnetization M within the data track to collapse forming two anti-parallel magnetic domains on opposite sides of the cross-tie wall.

The combination of the pattern of the serrated edges of the data track and the design of the propagate drive line, the wide-narrow edge pattern of stripline 22, establishes memory cells along the data track. To propagate the cross-tie, Bloch-line pairs in the well-known manner, each memory cell is required to include a store segment and a transfer segment, the order and names of which are purely arbitrary. These two segments are required due to the mechanism whereby cross-tie, Bloch-line pairs are propagated through a data track.

Initially, a cross-tie, Bloch-line pair is established in a first storage segment defined by the length of one serrated edge along the data track in which the cross-tie is oriented between the narrow width or portion of the data track and the associated Bloch-line is oriented between the two adjacent narrow portions and on the downstream side of the associated cross-tie. Next, a drive field separates the Bloch-line from the associated cross-tie, "pushing" the Bloch-line downstream into the next adjacent transfer segment leaving the associated cross-tie in its initial position within the store segment. Next, a nucleate drive field generates a cross-tie, Bloch-line pair between the separated cross-tie and Bloch-line. Next, an annihilate drive field annihilates the cross-tie, Bloch-line pair that is resident in the store segment effectively transferring the initial cross-tie, Bloch-line pair from the store segment into the downstream transfer segment of the memory cell. This sequence is repeated so that after two consecutive push-nucleate-annihilate cycles the cross-tie, Bloch-line pair has been propagated from a store segment to a transfer segment of the same memory cell and into the store segment of the next adjacent downstream memory cell.

Thus, in the illustrated embodiment, the center of the narrow portion of wide-narrow-edged stripline 22 and the corresponding narrow portion of serrated-edged data track 20 define a store segment while the downstream center of the wide portion of the wide-narrow-edged stripline 22 and the corresponding narrow portion of serrated-edged data track 20 define the transfer segment. Thus, each consecutive downstream-narrow-wide segment of stripline 22 defines a memory cell comprised of a store segment and a downstream transfer segment.

Figure 4:
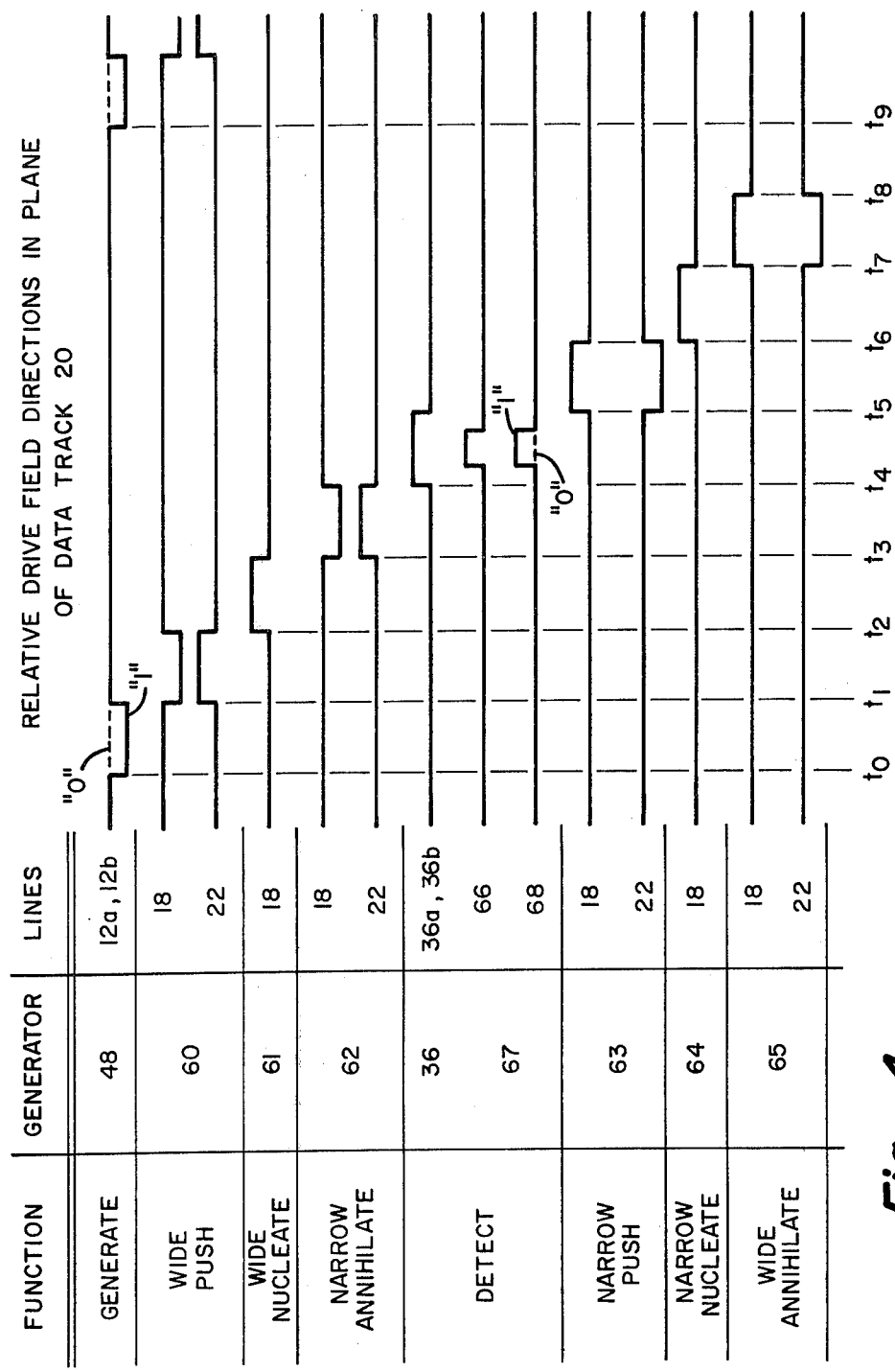
FIG. 4 is an illustration of an illustrative timing diagram for the operation of the cross-tie wall memory system of FIG. 1.
Figure 5A:
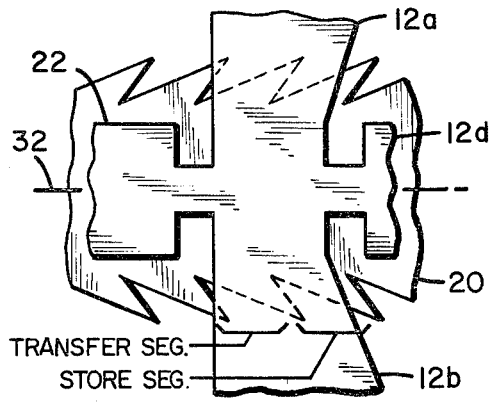
Figure 5B:
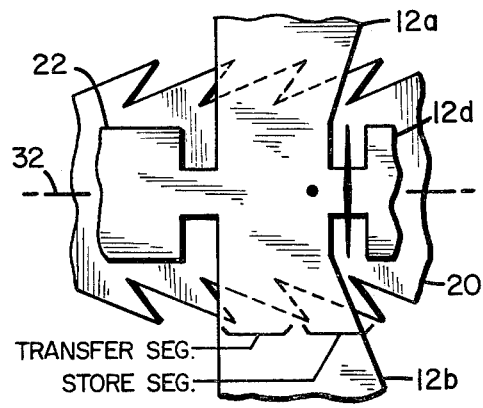

With respect to the timing diagram of FIG. 4, assume that prior to a time $t_0$ the generator 12 of FIG. 1 is empty having no cross-tie, Bloch-line pair established therein. This is as indicated in FIG. 5a. Now, at a time $t_0$, generator 48 couples a Generate current signal to generator 12, via conductive elements 12a, 12b, generating a cross-tie, Bloch-line pair in generator 12. This is as illustrated in FIG. 5b. Note that generator 48 selectively couples the Generate current signal to generator 12 for the generation vel non of a cross-tie, Bloch-line pair within generator 12. In the timing diagram of FIG. 4 the generation of the cross-tie, Bloch-line pair is indicative of the significant amplitude signal representative of the storage of a "1" in the cross-tie wall memory system of FIG. 1 while the insignificant signal is indicative of the storage of a "0" in the cross-tie wall memory system of FIG. 1.

Figure 5C:
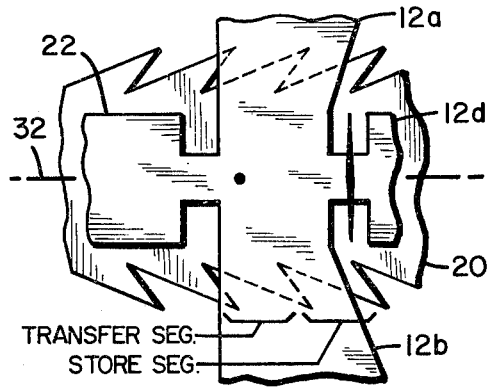

Next, at time $t_1$ with the Generate current signal terminated, generator 60, via closed normally-open switch $S_1$, couples a positive polarity Wide Push current signal to stripline 22 via conductive element 10b. Wide Push current signal flows down stripline 22 from left to right, through lines 50, 52, through stripline 18 from left to right, thence to ground. This Wide Push current signal "pushes" the Bloch-line in the store segment of the memory cell in generator 12 into the next adjacent downstream transfer segment thereof—this is as illustrated in FIG. 5c.

Figure 6:
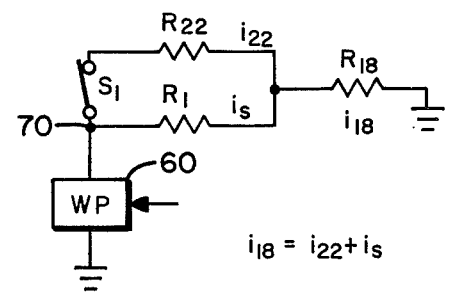
FIG. 6 is a diagrammatic circuit schematic for the push-annihilate current signals of FIG. 4.

With particular reference to FIG. 6, there is presented a diagrammatic circuit schematic of the equivalent circuit for the push-annihilate current generators 60, 62, 63, 65 of FIG. 1. When Wide Push current generator 60 couples the Wide Push current signal to the common point or node 70, with normally-open switch $S_1$ closed, the Wide Push current signal is coupled to the parallel combination of the resistance $R_{22}$ of stripline 22 and shunt resistance of resistor $R_1$ and the serially-coupled resistance $R_{18}$ of stripline 18. Shunt resistor $R_S$ is, for the four operations of FIG. 4: Wide Push at time $t_1$; Narrow Annihilate at time $t_3$; Narrow Push at time $t_5$; and Wide Annihilate at time $t_7$, selected to be of the desired magnitude to provide the desired relative current magnitude of $i_{22}$ and $i_{18}$ to flow down striplines 22 and 18, respectively. When such operations are discussed herein, the shunting effect of shunt resistors $R_1$, $R_2$, $R_3$ and $R_4$ shall not be discussed in detail, it being understood that the magnitude of the, e.g., Wide Push current signal in striplines 18 and 22 are not necessarily the same because of the use of the shunt resistors. Additionally, it is to be understood that because striplines 18 and 22 are on opposite sides of data track 20, current signals of the same polarity flowing in the same direction generate drive fields in the plane of data track 20 that are of the opposite polarity as indicated in FIG. 4. Lastly, the current signals shall be discussed as following from, e.g., left to right along stripline 22 even though the polarities of the different signals, e.g., Wide Push current signal from generator 60 and Narrow Annihilate current signal from generator 62, may be opposite.

Figure 5D:
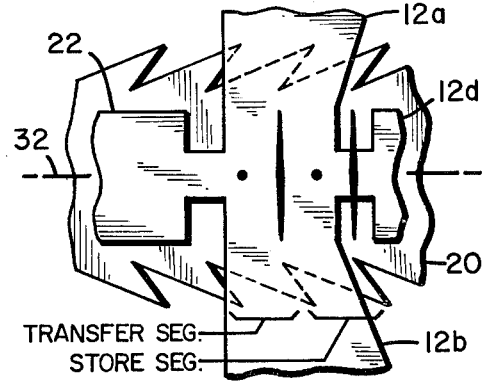

Next, at time $t_2$, with the Wide Push current signal terminated, generator 61, via line 52, couples a negative polarity Wide Nucleate current signal to stripline 18. Wide Nucleate current signal flows down stripline 18 left to right to ground. This Wide Nucleate current signal generates a new cross-tie, Bloch-line pair between the separated cross-tie, Bloch-line pair previously separated at time $t_1$—this is as illustrated in FIG. 5d.

Figure 5E:
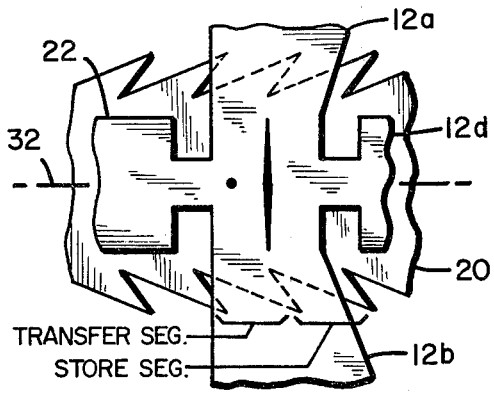
Figure 5F:
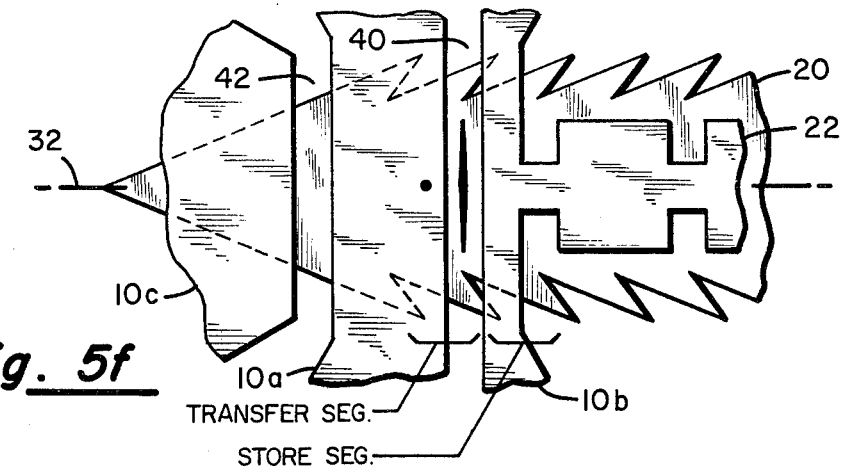

Next, at time $t_3$, with the Wide Nucleate current signal terminated, generator 62, via closed normally-open switch $S_2$, couples a positive polarity Narrow Annihilate current signal to strip-line 22 via conductive element 10b. Narrow Annihilate current signal flows down stripline 22 from left to right, through lines 50, 52 through stripline 18 from left to right, and thence to ground. This Narrow Annihilate current signal annihilates the cross-tie, Bloch-line pair resident in the store segment of the memory cell in generator 12—this is as illustrated in FIG. 5e. The cross-tie, Bloch-line pair generated in generator 12 in the store segment of the memory cell in generator 12 has now been propagated downstream into the next downstream associated transfer segment. Note that at this time a cross-tie, Bloch-line pair if previously as at time $t_0$, in the store segment immediately upstream of detector 10 would now be in the transfer segment of detector 10 as illustrated in FIG. 5f.

Next, a time $t_4$, with the Narrow Annihilate current signal terminated, generator 36, via lines 36a and 36b, couples Read current drive signals 33a and 33b—see FIG. 3—to electrically conductive elements 10c and 10b, respectively. As illustrated in FIG. 3, the Read current drive signals 33a and 33b from their respective conductive elements 10c and 10b flow down into the data track 20 that is within the respective gaps 42 and 40 and thence back up into the common conductive elements 10a and thence to ground. Concurrently, with a Read gating signal coupled to line 66 of differential sense amplifier 67 a relatively significant, indicative of the readout of a "stored 1," or insignificant, indicative of the readout of a "0," signal will be coupled to output line 68 indicative of the detection vel von of a cross-tie within gap 40 of detector 10. Note that as discussed hereinabove the narrow portion formed by the serrated-edge pattern of data track 20 forms a transfer segment for structuring the cross-tie within gap 40 during this readout operation.

Next, at time $t_5$, with the Read current signal terminated, generator 63, via closed normally-open switch $S_3$, couples a negative polarity Narrow Push current drive signal to stripline 22 via conductive element 10b. Narrow Push current signal flows down stripline 22 from left to right, through lines 50, 52, through stripline 18 from left to right, thence to ground. This Narrow Push current signal "pushes" the Bloch-line in the transfer segment of the memory cell in generator 12 into the next adjacent downstream memory segment thereof—this is as illustrated in FIG. 5g.

Next, at time $t_6$, with the Narrow Push current signal terminated, generator 64, via line 52, couples a negative polarity Narrow Nucleate current signal to stripline 18. Narrow Nucleate current signal flows down stripline 18 left to right to ground. This Narrow Nucleate current signal generates a new cross-tie, Bloch-line pair between the separated cross-tie, Bloch-line pair previously separated at time $t_5$—this is as illustrated in FIG. 5h.

Figure 5I:
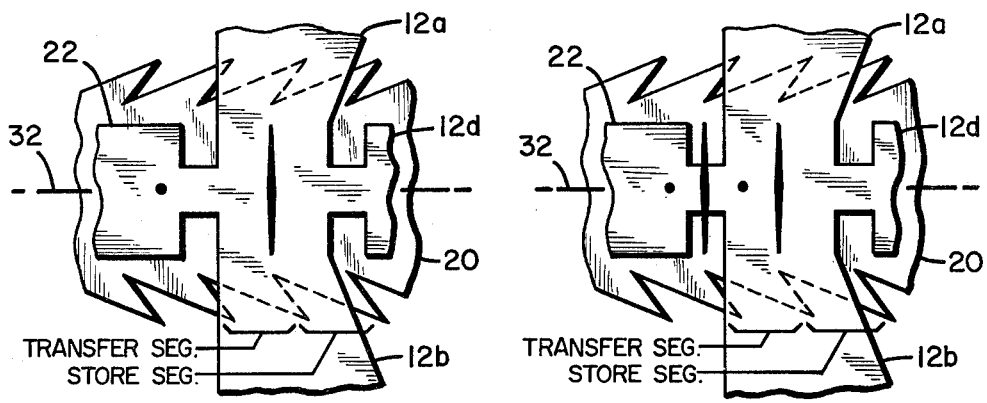
Figure 5I:
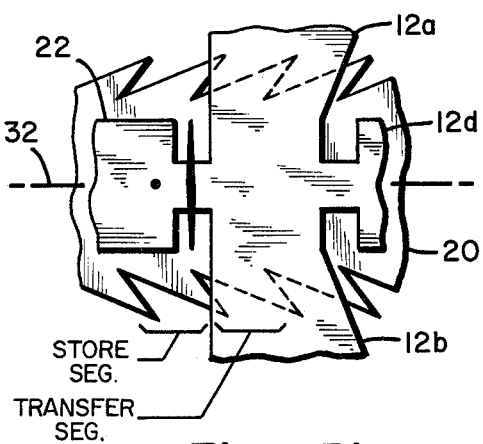

Next, at time $t_7$, with the Narrow Nucleate current signal terminated, generator 65, via closed normally-open switch $S_4$, couples a negative polarity Wide Annihilate current signal to stripline 22 via conductive element 10b. Wide Annihilate current signal flows down stripline 22 from left to right, through lines 50, 52, through stripline 18 from left to right and thence to ground. This Wide Annihilate current signal annihilates the cross-tie, Bloch-line pair previously resident in the transfer segment of the memory cell in generator 12 leaving the now-propagated cross-tie, Bloch-line pair resident in the store segment of the next downstream memory cell from generator 12—this is as illustrated in FIG. 5i.

Thus push/nucleate/annihilate sequence continues propagating the cross-tie, Bloch-line pairs generated by generator 12 through the shift register 14 and into the detector 10—see FIG. 5f—from whence the information is readout in the manner as described above with particular reference to FIG. 4 at time $t_4$.

FIG. 7 is a table of illustrative current signal durations and magnitudes for the timing diagram of FIG. 4.

What is claimed is:

1. A differential detector for a cross-tie wall memory system, comprising:

magnetic data track means whose two opposing edges are formed into a pattern of successive narrow and wide portions;

first, second and third separate conductive elements each of which are oriented transverse said data track means for forming a first gap between said first and second dectector elements and a second gap between said second and third detector elements, said first and second gaps centered about first and second narrow portions of said data track means, said first narrow portion capable of structuring a cross-tie thereat while said second narrow portion is incapable of structuring a cross-tie thereat;

detector current means for coupling first and second detector current signals to said first and third conductive elements, respectively; and, differential sense amplifier means coupled to said first, second and third conductive elements for detecting the difference between said first and second current signals as indicative of the presence of a cross-tie in said first gap and not in said second gap.

2. The differential detector of claim 1 in which said second narrow portion is formed of a terminating portion of said data track means that substantially terminates at a point.

3. The differential detector of claim 1 further including means for grounding said first and second current signals at said second conductive element.

4. The differential detector of claim 1 wherein said first and second current signals pass through said data track means in the areas of said first and second gaps, respectively.

5. The differential detector of claim 1 in which said difference between said first and second current signals is due to the difference in the magneto-resistive effect of the presence and absence of a cross-tie in said first and second gaps.

6. A differential detector for a cross-tie wall memory system, comprising:

magnetic data track means whose two opposing edges are formed into a pattern of successive narrow portions that form wide portions therebetween;

first, second and third conductive elements each of which are electrically conductively affixed to said data track means and are oriented transverse said data track means for forming a first gap between said first and second conductive elements and a second gap between said second and third conductive elements, said first and second gaps centered about first and second narrow portions of said data track means, said first narrow portion capable of structuring a cross-tie thereat while said second narrow portion is incapable of structuring a cross-tie thereat;

means for propagating a cross-tie into said first narrow portion;

detector current means for coupling first and second detector current signals to said first and third conductive elements, respectively, and for coupling said first and second current signals from said second conductive element; and, differential sense amplifier means coupled to said first and third conductive elements for detecting differences in said first and second current signals as indicative of the presence of a cross-tie in said first narrow portion within said first gap and not in said second narrow portion within said second gap.

7. A differential detector for a cross-tie wall memory system, comprising:

magnetic data track means;

first, second and third separate conductive elements each of which is oriented transverse said data track means for forming a first gap between said first and second detector elements and a second gap between said second and third detector elements;

differential means coupled to said first, second and third conductive elements for detecting the magneto-resistive difference in said data track within said first and second gaps as indicative of the presence of a cross-tie in said first gap and not in said second gap.

8. The differential detector of claim 7 in which the portion of said data track means in said second gap is incapable of structuring a cross-tie thereat.

9. The differential detector of claim 7 further including means for grounding said secod conductive element.

* * * * *